(12) United States Patent
Sattler et al.

(10) Patent No.: US 7,206,712 B2
(45) Date of Patent: Apr. 17, 2007

(54) TEST APPARATUS AND TEST METHOD FOR MIXED-SIGNAL SEMICONDUCTOR COMPONENTS

(75) Inventors: Sebastian Sattler, München (DE); Heinz Mattes, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/395,528

(22) Filed: Apr. 3, 2006

(65) Prior Publication Data

US 2006/0238392 A1   Oct. 26, 2006

(30) Foreign Application Priority Data

Apr. 1, 2005   (DE) .................. 10 2005 015 311

(51) Int. Cl.
*G01R 27/28* (2006.01)
(52) U.S. Cl. ..................................... 702/117
(58) Field of Classification Search ............... 702/117
See application file for complete search history.

(56) References Cited

U.S. PATENT DOCUMENTS

| 4,937,773 A | 6/1990 | Mittermaier et al. |
| 6,587,862 B1 | 7/2003 | Henderson |
| 2002/0198672 A1* | 12/2002 | Jungerman et al. ......... 702/106 |
| 2003/0030461 A1* | 2/2003 | Oberle et al. ............... 324/765 |
| 2005/0231228 A1 | 10/2005 | Mattes |

FOREIGN PATENT DOCUMENTS

WO   WO 2005/012933 A1   2/2005

OTHER PUBLICATIONS

Anderson, Russell "Getting the Most out of Delta-Sigma Converters", Texas Instruments Incorporated, *Analog Zone*, Apr. 2004.

* cited by examiner

*Primary Examiner*—John Barlow
*Assistant Examiner*—Demetrius Pretlow
(74) *Attorney, Agent, or Firm*—Edell, Shapiro & Finnan LLC (57) ABSTRACT

A semiconductor component is tested by providing a tester, a loadboard and an evaluation apparatus. The semiconductor component is operated using a test sequence, with the reference signal being applied to the semiconductor component or to the evaluation apparatus.

23 Claims, 8 Drawing Sheets

TEST APPARATUS AND TEST METHOD FOR MIXED-SIGNAL SEMICONDUCTOR COMPONENTS

CROSS REFERENCE TO RELATED APPLICATIONS

This application claims priority under 35 USC §119 to German Application No. DE 10 2005 015 311.9, filed on Apr. 1, 2005, and titled "Test Apparatus and Test Method for Mixed-Signal Semiconductor Components," the entire contents of which are hereby incorporated by reference.

FIELD OF THE INVENTION

The present invention relates to a test apparatus and a test method for mixed-signal semiconductor components. The invention also relates to a function generator.

BACKGROUND

Mixed-signal semiconductor components are integrated electrical circuits which process both digital and analog signals. A typical test apparatus for mixed-signal semiconductor components contains a loadboard for holding the semiconductor component which is to be tested. Electrical lines on the loadboard connect the semiconductor component to be tested to a tester. The tester actuates the semiconductor component in order to check its functionality. In addition, the test apparatus has a measuring apparatus which evaluates the output signals from the semiconductor component. Such a test apparatus is described, for example, in German Patent Application No. 103 41 836.9.

Testing mixed-signal semiconductor components frequently involves the use of function generators in order to generate reference signals. Function generators are electrical circuits whose output produces voltages or currents whose waveform has a desired shape and thus simulates a function. Typical functions which are simulated by function generators are square wave functions, sawtooth functions, noise and harmonic functions such as sine or cosine functions.

The reference signals provided by function generators in test apparatuses are either applied to the semiconductor components to be tested or are used as reference input signals for measuring apparatuses.

Particular demands are placed on these reference signals for testing mixed-signal semiconductor components. The metallurgy and measurement methods cause effects such as aliasing effects or phase noise, which produce errors in the measurement results. To eliminate said effects, the measurement results are averaged.

A sinusoidal reference signal therefore cannot be generated by function generators which generate just one period of the signal and then read this one period cyclically. In this case, the measurement results would merely be repeated and averaging would not eliminate said measurement errors. Rather, signals which are not obtained by merely repeating just one period need to be generated by the function generator for a plurality of periods. Sinusoidal functions are understood to mean sine and cosine functions in sine, cosine and linear combinations.

In the test apparatuses, long lines run from the function generators used to the semiconductor components which are to be tested or to the measuring apparatuses. These long lines impair the signal quality, which corrupts the measurement results. Possible sources of error are voltage drops on the lines and interference from radio-frequency radiation.

SUMMARY

The invention provides a test apparatus and a method in which the measurement results are not corrupted by interference on long lines. The invention further provides a function generator which is particularly suitable for use in test apparatuses. Additional features are also provided by the invention as described below.

In accordance with the invention, semiconductor component is tested by providing a tester, a loadboard and an evaluation apparatus. The loadboard provided with the semiconductor component, and a reference signal is generated according to the following: providing a number n of periods for which signal values are generated, where n is a natural number greater than 1; a number m of samples is provided, where n and m are prime numbers; a step size h is stipulated on the basis of the equation h=n*360°/m; the initial value for the cosine $x_0$ and for the sine $y_0$ is stipulated; the cosine value $x_{i+1}$ and the sine value $y_{i+1}$ for the following time (i+1)*h are calculated from the sine value $y_i$ and the cosine value $x_i$ for the present time i*h, the calculation being performed in an electrical circuit which is situated on the loadboard or in the semiconductor component to be tested; and the previous calculation is repeated in a loop with a control variable i which runs from 0 to m. The semiconductor component is operated using a test sequence, with the reference signal being applied to the semiconductor component or to the evaluation apparatus.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION

A test apparatus is provided in accordance with the invention for testing a semiconductor component comprises a loadboard that includes an evaluation apparatus, a function generator and connections that connect to the semiconductor component which is to be tested.

A tester provided in the test apparatus controls the evaluation apparatus, the function generator and the semiconductor component which is to be tested. The evaluation apparatus contains an input which is connected to a connection that connects to an output of the semiconductor component which is to be tested. An output of the function generator is connected to an input of the evaluation apparatus, to a connection that connects to an input of the semiconductor component which is to be tested or to an internal node of the semiconductor component which is to be tested.

By way of example, if the reference signal is routed to an input of the semiconductor component which is to be tested and not to the evaluation apparatus, it suffices for the evaluation apparatus to comprise just an output connection on the loadboard and for further evaluation apparatuses to be provided outside of the loadboard.

The evaluation apparatus and the function generator can also be integrated together in a semiconductor component, e.g. an FPGA, which reduces the space requirement for the overall test apparatus. The evaluation apparatus may also be in the form of part of the semiconductor component which is to be tested.

The reference signal is connected to an internal node of the semiconductor component which is to be tested when the function generator is integrated in the semiconductor component which is to be tested.

The function generator contains a first and a second adding block. The first adding block includes a sine input, a cosine input and an output. The adding block is designed such that it calculates the cosine value $x_{i+1}$ for the following time $(i+1)*h$, where h is a stipulated step size and i is a natural number.

The second adding block includes a sine input, a cosine input and an output. It is designed such that it calculates the sine value $y_{i+1}$ for the following time $(i+1)*h$. The sine inputs of the first adding block and of the second adding block have the sine value $y_i$ for the present time $i*h$ applied to them, and the cosine inputs of the first adding block and of the second adding block have the cosine value $x_i$ for the present time $i*h$ applied to them.

The number of periods to be output by the function generator and the step size can be set by input signals for the function generator.

With the function generator being provided on the loadboard, the reference signals generated by the function generator need to be routed only via lines on the loadboard. Long lines from the tester or to an externally provided measuring apparatus are thus not necessary. The short lines for the reference signal prevent voltage drops on the lines or radiated interference from radio-frequency signals from interfering with the reference signals and hence with the measurement results.

The recursive method of calculation allows the sine signal and the cosine signal to be generated in optimum fashion in terms of area and gates. Since the function generator requires little space, it can be accommodated on the loadboard or in the semiconductor component.

In one embodiment of the invention, the first adding block and the second adding block include respective correction inputs. These correction inputs include respective data stores connected to them which contain correction values for a plurality of times. The data stores do not need to contain correction values for all times, but rather it is sufficient if a few calculated values are corrected. The correction values can be stored in a ROM, for example. The sine and cosine values are calculated exactly at discrete times $h*i$. However, the limited calculation accuracy in the adding blocks results in discrepancies when calculating the values of the angle function. These discrepancies differ from time to time. Errors in the calculation of a value are also still present when calculating the values for later times, since the calculation is performed recursively.

Rounding the result values would alter only the position but not the magnitude of the calculation error. In addition, rounding requires a twofold complexity. It is first of all necessary to decide whether rounding digit positions are added, and then the additional operation needs to be performed. This increases the execution time for the calculation overall.

If the frequency and the amplitude resolution of the function generator can be programmed by input signals for the function generator, the measurements can be performed on the basis of these parameters. Such parameter variation is a frequent application for test apparatuses.

The first adding block preferably calculates the value for the cosine value on the basis of $x_{i+1}=a*x_i+b*y_i+e_i$ and the second adding block preferably calculates the sine value $y_{i+1}$ on the basis of $y_{i+1}=c*x_i+d*y_i+f_i$. In this case, a, b, c and d are constants which apply for all times. $e_i$ and $f_i$ are error correction terms for the present time $i*h$. The recursive calculation of the sine and cosine values saves the values for each time from having to be recalculated completely. Rather, the values for the following time are calculated from the ascertained cosine and sine values. Accordingly, the recursive function generator also requires fewer gates than a function generator which calculates the values for each time separately.

The linearization of the cosine value and of the sine value makes the calculation by digital signal processing accessible. This means that it is possible to predict which values are calculated for the various times. Function generators with the same component types would generate the same respective output signal, given the same programming. In addition, the function generator can be synthesized using purely digital logic, which reduces the development complexity.

The direct calculation of sine and cosine calculates the new value $(x_{i+1}, y_{i+1})$ from the sine and cosine values of the predecessor $(x_i, y_i)$. In line with the definition of polar coordinates, the following is true for each point $P(x_i, y_i)$ on the circle of unit radius:

$$x_i = \cos(\alpha)$$

$$y_i = \cos(\alpha).$$

For the values of the successor $(x_{i+1}, y_{i+1})$, the following applies in line with the addition theorems:

$$x_{i+1}=\cos(\alpha+h)\cos(\alpha)\cos(h)-\sin(\alpha)\sin(h)=x_i\cos(h)-y_i\sin(h)$$

$$y_{i+1}=\cos(\alpha+h)\cos(\alpha)\sin(h)+\sin(\alpha)\cos(h)=x_i\sin(h)+y_i\cos(h).$$

Rearrangement gives:

$$x_{i+1}=x_i-x_i(1-\cos(h))-y_i\sin(h)$$

$$y_{i+1}=y_i-y_i(1-\cos(h))+x_i\sin(h).$$

The new cosine value $x_{i+1}$ and the new sine value $y_{i+1}$ are calculated from the predecessor values $x_i$ and $y_i$ by subtraction and/or addition. With $1-\cos(h)=1-(1-\sin^2(h))^{0.5}$, and the number of steps N for a half-cycle, $h=180°/N$, it follows that:

$$\sin(h)=\sin(\pi/N)=\Sigma s_j 2^{-j}, \text{ for } s_j \in [0,1]$$

$$1-\cos(h)=1-\cos(\pi/N)=\Sigma r_j 2^{-j} \text{ for } c_j \in [0,1]$$

where sin(h) and 1−cos(h) are therefore fixed variables. The above equations are implemented by adding or subtracting a summand or subtrahend for each "1" of the binary representation of sin(h) or of 1−cos(h). The summands are obtained in this case by right-shifting from $x_i$ or $y_i$. The number of digit positions depends on the calculation accuracy p. The exponential representations give:

$$x_{i+1}=x_i-x_i\Sigma r_j 2^{-j}-y_i\Sigma s_j 2^{-j}$$

$$y_{i+1}=y_i-y_i\Sigma r_j 2^{-j}+x_i\Sigma s_j 2^{-j}$$

where $r_j$ and $s_j$ are $\in[0,1]$ and $j \in [0,1,2,\ldots,p]$. $2^j-2^k=2^{j-1}+2^{j-2}+\ldots+2^{k+1}2^k$ for $j>k+1$ allows successive ones to be combined. For p digit positions, only a maximum of p/2+1 summands are therefore required.

Each $r_j$ and $s_j$ differing from zero can be interpreted as a right-shift through j digit positions of the associated $x_i$ or $y_i$. The equations can therefore be implemented through additions and subtractions.

Digit positions which, owing to the right-shift, have a lesser significance than the calculation accuracy are dispensed with. This simplifies the implementation without any great losses of accuracy.

By way of example, the number of steps is N>804 and $\sin(h)<0.01_H$ and $1-\cos(h)<0.0008_H$. With a calculation accuracy p of 20 digit positions, sin(h) has 12 valid digit positions and 1−cos(h) has three valid digit positions. Therefore, $x_{i+1}$ and $y_{i+1}$ are formed from no more than 1+7+2=10 summands. If, by contrast, the calculation accuracy p is increased to 24 digit positions, a maximum of 14 summands is required.

The adding blocks have adders, subtractors and shifters. The multiplication operations are performed by these adders, subtractors and shifters. This means that the multiplication operations are performed in optimized fashion in terms of gates. As shown above, further minimization of the necessary calculation operators is possible by combining summands.

Sum formation can be achieved through recursive addition in just one adder. In this case, there is a second recursion loop, in which the individual summands are successively added in the adder to produce an intermediate result. The implementation with just one adder uses minimal area, even if yet further logic is required in order to introduce the various summands.

Alternatively, the calculation can be performed in a tree structure comprising parallel-connected and series-connected adders and subtractors. Although more area is required for the multiplicity of adders and subtractors in this case, the calculation is effected much more quickly. There is no need for a complex flow controller in this case in order to supply the individual summands successively to the adder.

Preferably, a register for the cosine value $x_{i+1}$ is connected downstream of the tree structure comprising the adders and subtractors in the first adding block. In the second adding block, a register for the sine value $y_{i+1}$ is likewise connected downstream of the tree structure comprising the adders and subtractors. A flow controller has a clock supplied to it and connects the outputs of the registers in the adding blocks to the cosine inputs and the sine inputs of the adding blocks in a subsequent cycle. In this case, the output of the register in the first adding block is connected to the cosine inputs, and the output of the register in the second adding block is connected to the sine inputs. By providing the registers in the adding blocks, the values for the present time are available in the adding blocks themselves and can be routed to the cosine inputs and the sine inputs via short lines.

The test apparatus can be used for a multiplicity of semiconductor components, such as digital semiconductor components, analog semiconductor components and memory components, but is particularly suitable for testing mixed-signal semiconductor components. With these, it is particularly important that the number of periods to be output and the step sizes are programmable. This makes it possible to prevent the reference signals from being generated by merely repeating one period of the reference signal. Only in this way it is possible to prevent measurement errors, for example caused by aliasing defects and phase noise, by averaging the measurement results.

The invention also provides an electrical circuit for generating a sinusoidal signal. This circuit includes a first adding block which calculates the cosine value $x_{i+1}$ for the following time (i+1)*h. In this case, h is a stipulated step size and i is a natural number. A second adding block calculates the sine value $y_{i+1}$ for the following time (i+1)*h. The first and second adding blocks each include a sine input, a cosine input, a correction input and an output. In this case the sine inputs of the adding blocks have the sine value $y_i$ for the present time i*h connected to them, and the cosine inputs of the adding blocks have the cosine value $x_i$ for the present time connected to them.

The correction inputs of the adding blocks include respective data stores containing correction values for a plurality of times connected to them. These data stores are ROMs or RAMs, for example. It is not necessary for there to be correction values for all times. However, at least one correction value which is not equal to zero needs to be present for at least one time which is not equal to the initialization time at i=0.

In one embodiment, the first adding block calculates the cosine value $x_{i+1}$ on the basis of the formula $x_{i+1}=a*x_i+b*y_i+e_i$, and the second adding block calculates the sine value on the basis of $y_{i+1}=d*y_i+c*x_i+f_i$. In this case, a, b, c and d are constants which are the same for all times. $e_i$ and $f_i$ are error correction terms for the present time i*h. The linearized terms can be calculated using digital signal processing, because this can be used to perform multiplication and addition operations. Digital signal processing is distinguished by long-term stability and heat stability and high reliability. When the number of periods of the sinusoidal signal which are to be output and the step size h can be set by input signals for the electrical circuit, it is possible to generate a multiplicity of periods for output in which the individual periods are not merely repeats of preceding periods. This is necessary particularly for mixed-signal semiconductor components so that measurement errors can be eliminated by averaging the measurement results.

In one embodiment of the invention, a first adding block calculates the value for the cosine $x_{i+1}$ on the basis of the formula:

$$x_{i+1}=x_i-x_i*\Sigma r_j*2^{-j}-y_i*\Sigma s_j*2^{-j}+e_i$$

and the second adding block calculates the sine value $y_{i+1}$ on the basis of the formula:

$$y_{i+1}=y_i-y_i*\Sigma r_j*2^{-j}+x_i*\Sigma s_j*2^{-j}+f_i.$$

In this case, $\Sigma r_j*2^{-j}$ and $\Sigma s_j*2^{-j}$ are exponential representations of constants. In this case, $r_j$ and $s_j$ are one of the elements "zero" and "one", and j is a natural number between 0 and p. In this case, p is the calculation accuracy, i.e. the number of digit positions after the decimal point. The sums $\Sigma$ always run from 0 to p in this context.

In this embodiment, the adding blocks contain adders, subtractors and shifters which are used to perform the multiplication operations. This results in a low gate requirement for implementing the electrical circuit. This is particularly important when the electrical circuit is put on a loadboard, on which there is only limited space.

In a further embodiment of the electrical circuit, the frequency and amplitude resolution of the sinusoidal signal which is to be output can advantageously be programmed by input signals. This means that the electrical circuit can be used for a plurality of required frequencies and amplitude resolutions.

If the multiplication operation is performed by recursive addition in just one adder, a function generator with a particularly minimal area requirement is obtained. The summands are supplied individually from a flow controller to the adder, which adds or subtracts them individually in succession. Despite the complexity for the flow controller, the adding block requires only little space, because it contains only one adder.

When, by contrast, the multiplication operation is performed in a tree structure comprising parallel and series-connected adders and subtractors, the function values for sine and cosine are calculated quickly, since a large number of additions and subtractions are performed in parallel. In one embodiment of the invention, the adders and subtractors comprise canonical elements which are set according to the required step size h. In this context, canonical elements are function blocks which can perform a multiplicity of functions, depending on programming. In the present case, the canonical elements can perform the addition for all step sizes and number of periods which are specified within a defined range.

In line with another embodiment, the electrical circuit contains a register for the cosine value $x_{i+1}$ for the following time (i+1)*h downstream of the tree structure comprising the adders and subtractors in a first adding block. The second adding block contains a register for the sine value $y_{i+1}$ for the following time (i+1)*h downstream of the tree structure comprising the adders and subtractors. A flow controller is supplied with a clock and connects the outputs of the registers to the cosine inputs and the sine inputs of the adding blocks in a subsequent clock cycle. In this case, the register in the first adding block is connected to the cosine inputs, and the output of the register in the second adding block is connected to the sine inputs.

With the registers being provided in the adding blocks, the cosine and sine values do not need to be stored externally and can be supplied to the cosine and sine inputs of the adding blocks again via short lines.

The invention also provides a method for testing an electrical semiconductor component in which a tester, a loadboard and an evaluation apparatus are provided. The loadboard is provided with an electrical semiconductor component, and then a reference signal is generated.

To this end, a number n of periods is first of all stipulated, where n is a natural number greater than 1. For this number of periods, the signal values need to be generated. In addition, a number m of samples is stipulated, where n and m are prime numbers. Furthermore, the step size h is stipulated on the basis of the equation n*360°/m. The initial value, i.e. the value at time zero, for the cosine $x_0$ and the initial value for the sine $y_0$ are determined. By way of example, $x_0=1$ and $y_0=0$, but other initial values may also be determined. Next, a loop is executed in which a control variable i is incremented from 0 to m.

Within this loop, the cosine value $x_{i+1}$ and the sine value $y_{i+1}$ for the following time (i+1)*h are calculated from the sine value $y_i$ and the cosine value $x_i$ in each step. In this case, $x_i$ is the cosine value and $y_i$ is the sine value for the present time i*h. The calculation is performed in an electrical circuit which is situated on the loadboard or in the electrical semiconductor component to be tested.

In parallel with the generation of the reference signal, the electrical component is operated by applying a test sequence to it. The reference signal is connected either the electrical component or to the evaluation apparatus. The fact that the reference signal is provided on the loadboard or on the semiconductor component to be tested means that the lines used to transmit the reference signal are short. Only small voltage drops arise across the electrical lines, and the risk of radio-frequency interference being injected is reduced.

The fact that n and m are prime numbers ensures that none of the n periods is a mere copy of another period. The samples have different phases in the various periods. If the first period contains a sample at 10°, for example, then the second period does not have a sample at 10°. In line with the method, a sequence of n non-repetitive periods is provided. However, there are certainly embodiments in which the sequence of n periods is repeated entirely. This repetition may also occur a plurality of times. Usual values for the number n of periods are values between 1 and 20. The number m of samples is between 512 and 4096, for example.

In one embodiment of the invention, the cosine value $x_{i+1}$ and the sine value $y_{i+1}$ are advantageously calculated on the basis of the formula:

$$x_{i+1}=a*x_i+b*y_i+e_i; \text{ and}$$

$$y_{i+1}=d*y_i+c*x_i+f_i.$$

In this case, a, b, c and d are constants which are the same for all times. The error correction terms $e_i$ and $f_i$ apply only to the present time. The error correction terms correct the sine and cosine values such that the calculation errors which occurred previously are eliminated again. Since the method of calculation is deterministic, i.e. the time at which what value is calculated is known, the error correction terms are able to eliminate the errors completely.

In one embodiment of the invention, the cosine value $x_{i+1}$ and the sine value $y_{i+1}$ are calculated on the basis of the formula:

$$x_{i+1}=x_i-x_i*\Sigma r_j*2^{-j}-y_i*\Sigma s_j*2^{-j}+e_i; \text{ and}$$

$$y_{i+1}=y_i-y_i*\Sigma r_j*2^{-j}+x_i*\Sigma s_j*2^{-j}+f_i.$$

where $\Sigma r_j*2^{-j}$ and $\Sigma s_j*2^{-j}$ are exponential representations of constants with $r_j, s_j \in \{0,1\}$ and $j \in [0,1,2,\ldots,p]$. In this case, p is the calculation accuracy, i.e., the digit positions after the decimal point for the sine value and the cosine value. The multiplication operations are replaced by additions, subtractions and shifts in this case. This makes it possible to simplify the calculations for the multiplications, because operands can be combined, as shown above, which reduces the calculation complexity.

When the multiplication operations are performed in a plurality of recursive additions in just one adder in this case, the electrical circuit used is particularly small and can also be used for limited space conditions on the loadboard and in the semiconductor component. When the multiplication operations are performed in a tree structure comprising parallel and series-connected additions and subtractions, the multiplication is performed particularly quickly. This is particularly necessary at high frequencies and when there are a large number of samples.

The invention is further described below with reference to the Figures.

Figure 1:
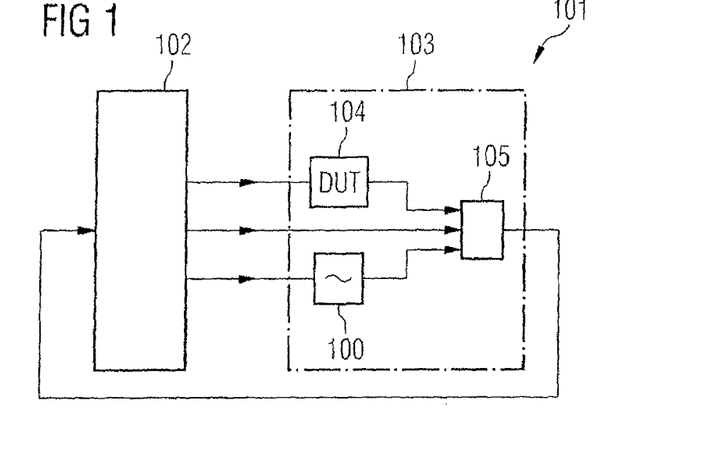
FIG. 1 schematically depicts an exemplary embodiment of a test apparatus of the invention.

FIG. 1 schematically depicts an exemplary embodiment of a test apparatus 101 of the invention with a tester 102 and a loadboard 103. The loadboard 103 includes a semiconductor component 104 which is to be tested, an evaluation apparatus 105 and a function generator 100. The tester uses electrical lines to control both the semiconductor component 104 which is to be tested and the function generator 100 and the evaluation circuit 105. The electrical component to be tested is operated in a test mode and outputs an output signal to the evaluation apparatus 105. The evaluation apparatus 105 compares the output signal from the semiconductor component 104 which is to be tested with an output signal from the function generator 100. The result of this comparison is sent to the tester.

Figure 2:
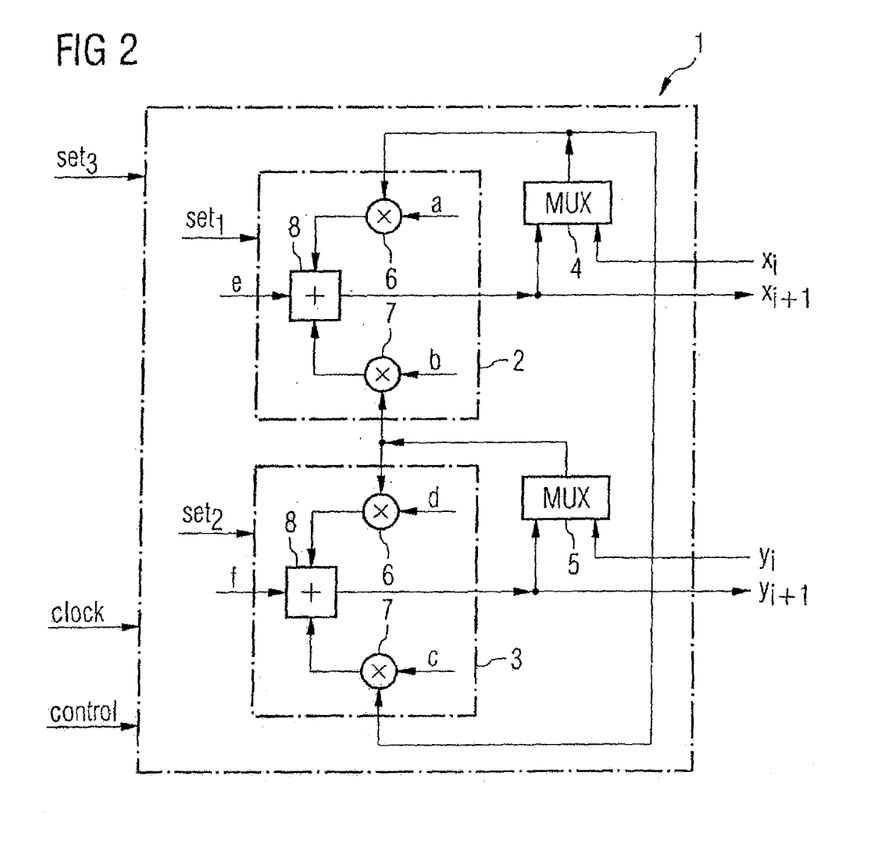
FIG. 2 depicts the function blocks in an electrical circuit for generating a sinusoidal and a cosinusoidal signal in accordance with the invention.

FIG. 2 shows a functional illustration of an electrical circuit of the invention for generating a sinusoidal signal. The electrical circuit 1 contains, as input signal, the clock signal clock, the control signal control, the setting signal $set_3$, the cosine signal for the present time $x_i$ and the sine signal for the present time $y_i$. The output signals from the electrical circuit 1 are the cosine value for the following time $x_{i+1}$ and the sine value for the following time $y_{i+1}$.

The electrical circuit 1 includes a first adding block 2, a second adding block 3, a first multiplexer 4 and a second multiplexer 5. The adding blocks 2 and 3 each contain a first multiplier 6, a second multiplier 7 and an adder 8.

The inputs of the multiplier 6 in the first adding block 2 receive firstly the constant value a and secondly the output signal from the multiplexer 4. The inputs of the multiplier 7 in the adding block 2 are connected to the value b and to the signal output of the multiplexer 5. The inputs of the adder 8 receive the output signal from the multiplier 6, the output signal from the multiplier 7 and the error correction signal with the value e. The adding block 2 is also connected to the setting signal $set_1$, which sets the values for a and b. The output of the adder 8 in the adding block 2 is connected to a first input of the multiplexer 4. The other input of the multiplexer 4 has the cosine value for the present time $x_i$ connected to it. The output of the adder 8 in the adding block 2 provides the cosine value $x_{i+1}$ at its output and can be read from the outside.

The inputs of the multiplier 6 in the adding block 3 receive the value d and also the output signal from the multiplexer 5. The inputs of the multiplier 7 are connected to the signal value c and to the output signal from the multiplexer 4. The inputs of the adder 8 in the adding block 3 receive the output from the multiplier 6 in the adding block 3, the output from the multiplier 7 in the adding block 3 and also the error correction signal f.

The adding block 3 also includes the setting signal $set_2$ connected to it, which sets the values for c and d. The output of the adder 8 in the adding block 3 provides the sine value for the following time $y_{i+1}$. The inputs of the multiplier 5 have the sine values for the present time $x_i$ and the following time $x_{i+1}$ connected to them. The clock signal clock looks after the flow control and particularly the switching of the multiplexers 4 and 5. The setting signal $set_3$ is used to program the setting signals $set_1$, and $set_2$. The control signal control initializes the electrical circuit 1 and switches it on and off.

The electrical circuit 1 calculates the cosine value for the following time $x_{i+1}$ and the sine value for the following time $y_{i+1}$ on the basis of the formula:

$$x_{i+1}=a^*x_i+b^*y_i+e;\text{ and}$$

$$y_{i+1}=d^*y_i+c^*x_i+f.$$

The correction terms e and f ensure that errors which arise from the limited accuracy are compensated for.

Figure 3:
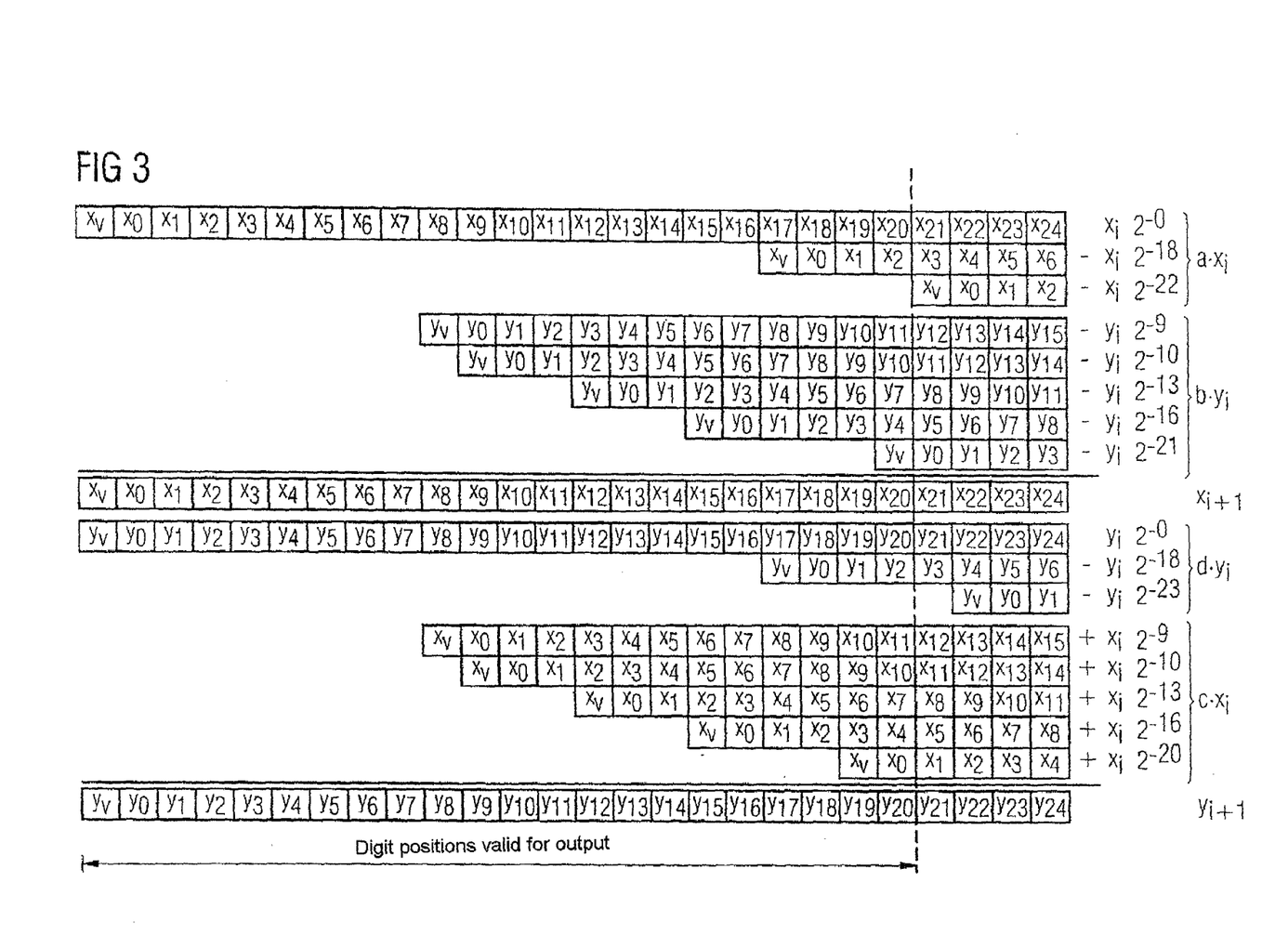
FIG. 3 depicts the calculation operations which are performed in the electrical circuit of FIG. 2.

FIG. 3 illustrates the calculation operations which are performed in the electrical circuit. In the example shown, the coefficients:

$$a=0.FFFFBC_H=2^0-2^{-18}-2^{22},$$

$$b=0.00C908_H=-2^{-9}-2^{-10}-2^{-13}-2^{-16}-2^{-21},$$

$$c=0.00C91_H=-2^{-9}-2^{-10}-2^{-13}-2^{-16}-2^{-20},\text{ and}$$

$$d=0.FFFFBE_H=2^0-2^{-18}-2^{-23}$$

have been chosen. The output accuracy is assumed to be q=20, and the calculation accuracy p=24. This means that a number, including its arithmetic sign, has 26 digit positions, 24 of which come after the decimal point which has been written out.

For each of 0 different $a_j$, $b_j$, $c_j$ and $d_j$, a summand with p-j plus two digit positions is formed, whose arithmetic sign corresponds to that of $a_j$, $b_j$, $c_j$ and $d_j$, respectively. FIG. 3 shows the operands selected on the basis of this rule. Since sine and cosine may be positive and negative, the 2's complement is used for calculation. In this connection, $x_v$ and $y_v$ correspond to the digit position for the arithmetic sign.

In this case, the top part of FIG. 3 shows the calculation of the cosine value for the following time $x_{i+1}$, and the bottom part shows the calculation of the sine value for the following time $y_{i+1}$.

Figure 4:
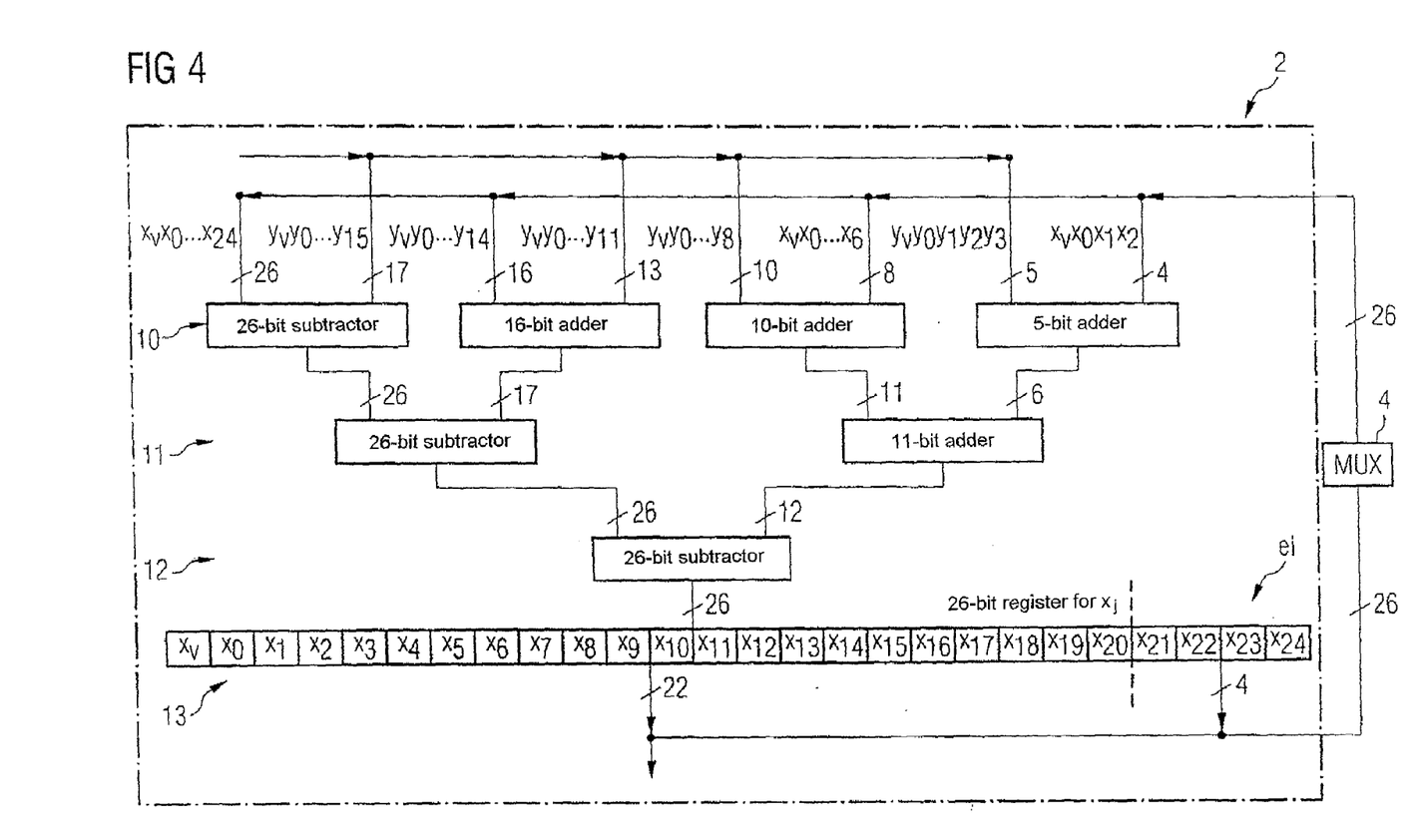
FIG. 4 depicts an exemplary embodiment of a function block from FIG. 2 for calculating a cosinusoidal signal.

FIG. 4 shows an exemplary embodiment of the adding block 2 in the electrical circuit 1 which is used to calculate the cosine value for the following time. The adding block 2 contains a tree structure comprising subtractors and adders on the first level 10, a second level 11 and a third level 12, and also a register 13. Level 10 contains a 26-bit subtractor, a 16-bit adder, a 10-bit adder and a 5-bit adder. The four adders and subtractors add the eight operands indicated in FIG. 3 in order to calculate the cosine value for the following time in pairs in each case.

In this case, the summands have been organized according to bit length. Starting with the longest, two respective summands are supplied to an adder when the arithmetic sign is the same and to a subtractor when the arithmetic sign is not the same. The width of the adder or subtractor and the arithmetic sign of the result are determined by the longer summand, and the missing digit positions in the shorter summand are produced with the digit position for the arithmetic sign. Remaining operands are covered in the following level.

The calculated sum or difference is complemented by the carry and is therefore one bit longer if the width w of the adder or subtractor is less than p+2. In this case, p is the calculation accuracy and, in this example, 24 bits. If the width w is greater, it is not necessary to include a carry, because the additions and subtractions never produce a value outside of the functional range [−1,1] for cosine and sine. The output signal from the 26-bit subtractor is thus likewise 26 bits long. In the case of the adders on level 10 of the adding block 2, the output signal is respectively one bit longer than the longest input signal. The results and any remaining operands are combined, again in pairs starting from the right, by adders or subtractors.

The output signals from the first level 10 are connected to the 26-bit subtractor and to the 11-bit adder on the second level 11. The two results from the second level 11 are combined on the third level 12 in the 26-bit subtractor. The output signal from the third level 12 is stored in the register 13. The register 13 is 26 bits long, only 22 bits of which are output. For calculating the cosine value $x_{i+1}$ for the following time, all 26 bits are used, however.

To ensure the correct time for connecting the register content to the input of the adding block 2, the multiplexer 4 is situated between the register and the input. The first level 10 receives the cosine values $x_i$ and the sine values $y_i$ as input signals, in each case as 26-bit data. The adders are supplied only with the respective data bits which are needed.

Figure 5:
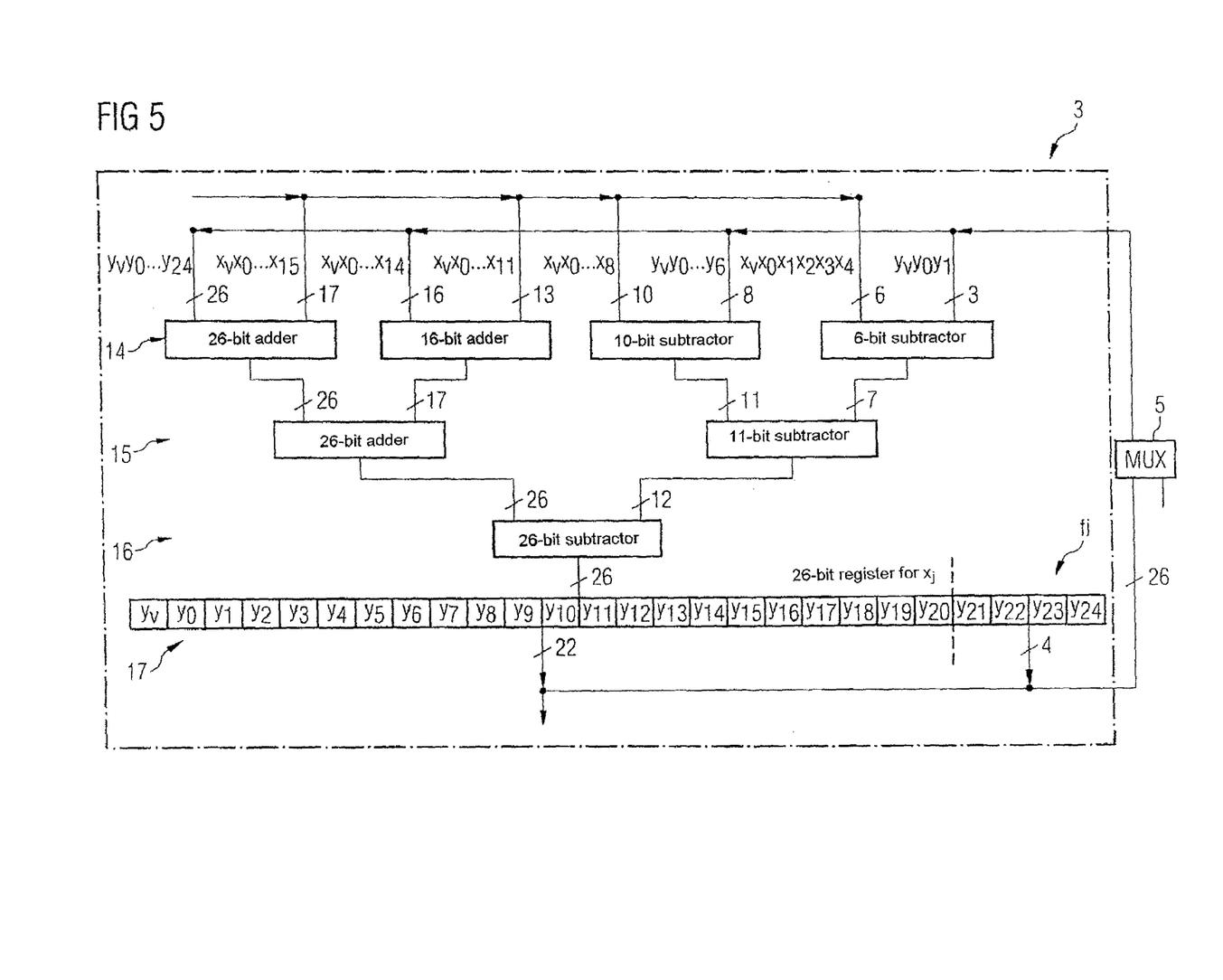
FIG. 5 depicts an exemplary embodiment of a function block from FIG. 2 for calculating a sinusoidal signal.

FIG. 5 shows details of the adding block 3 which is used to calculate the sine value on the basis of the example from FIG. 3. Components having functions as in the preceding figures are provided with the same reference symbols and are not explained separately.

The adding block 3 contains a tree structure comprising adders and subtractors, comprising a first level 14, a second level 15 and a third level 16, and also a register 17. The adders and subtractors are arranged on the basis of the same rules as the adders and subtractors in the adding block 2. They calculate the sine value $y_{i+1}$, which is stored in the 26-bit register 17.

As input signal for the first level, the values for the cosine value $x_i$ and for the sine value $y_i$ are available. In this case, the values for the cosine value $x_i$ are obtained from the adding block 2, as illustrated in FIG. 4. In this exemplary embodiment, the error correction is performed by virtue of the register values being overwritten at particular times. In this case, errors which have arisen previously as a result of the finite calculation accuracy are overwritten. Values which can be overwritten are the minimum and maximum values for the sine value, for example. Any values situated in between can also be set using the correction signal $f_i$, however. In this case, the values for the sine signal and the cosine signal can be set at different times. The values to be set are output and controlled directly from a correction ROM.

Another way of correcting the calculation result is for additional correction terms to be added during the calculations of the cosine value and of the sine value.

Figure 6:
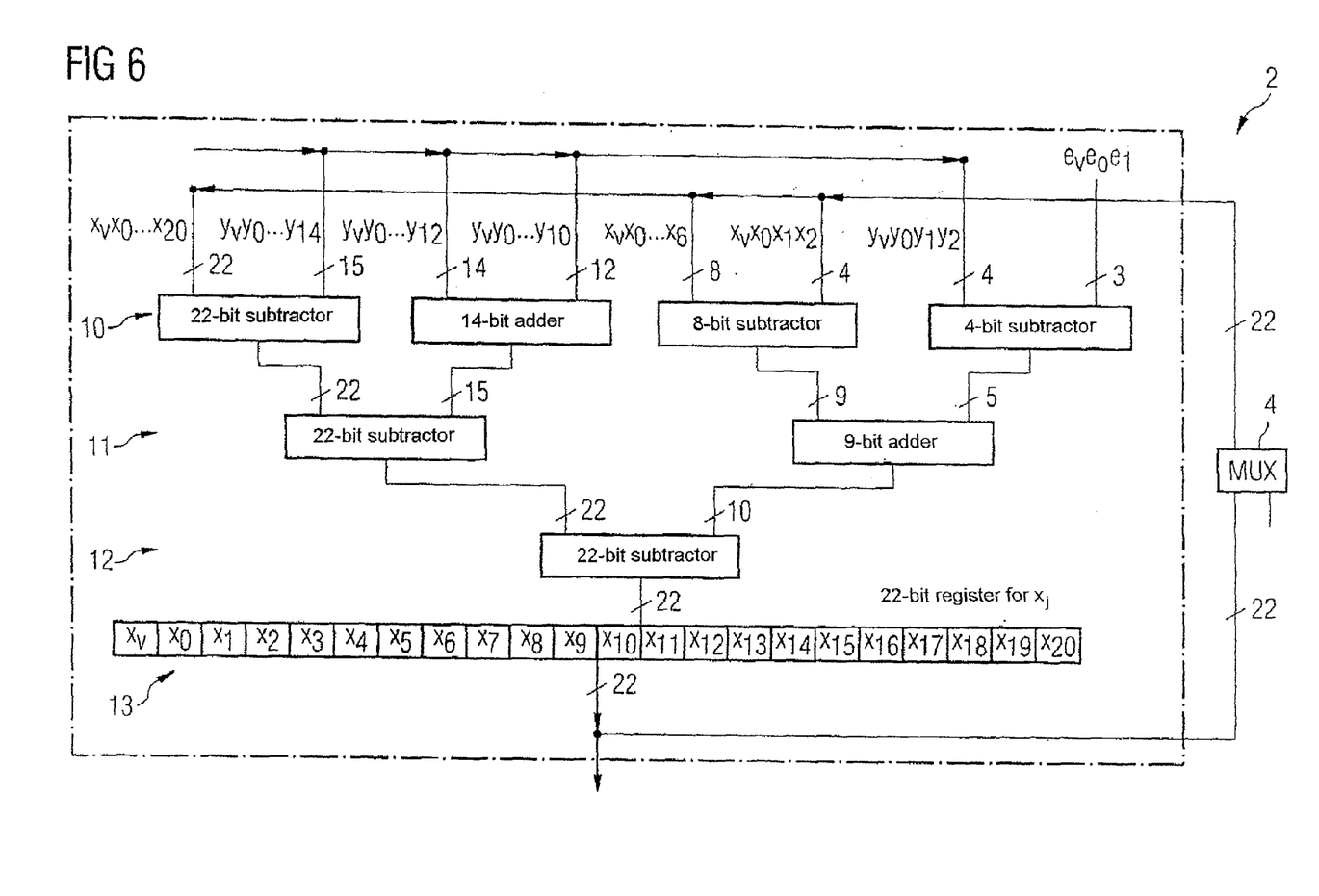
FIG. 6 depicts another exemplary embodiment of a function block for calculating a cosinusoidal signal in accordance with the invention.

FIG. 6 shows an exemplary embodiment of an adding block 2 which calculates the cosine value $x_{i+1}$ by taking into account the correction terms. In this context, the output accuracy q and the calculation accuracy p are of equal magnitude and have the value 20. A further correction term $e_v e_0 e_1$ is subtracted in the first level 10 of the adding block 2. The correction term $e_v e_0 e_1$ is supplied from a correction ROM. For m=4096, n=7, the coefficients a, b, c and d are obtained as a=d=0.FFFC4$_H$ and b=c=0.02BFC$_H$. The values for the cosine value $x_{i+1}$ and the sine value $y_{i+1}$ become:

$$x_{i+1} = x_i - x_i 2^{-14} + x_i 2^{-18} + y_i 2_{-6} - y_i 2^{-8} - y_i 2^{-10} - y_i 2^{-18} + e_i;$$

and $$y_{i+1} = y_i - y_i 2^{-14} + y_i 2^{-18} - x_i 2^{-6} + x_i 2^{-8} + x_i 2^{-10} + x_i 2^{-18} + f_i.$$

In the case of the summands, below the calculation accuracy p, i.e., after 20 digit positions after the decimal point, the digit positions are cut off. On the basis of the rules for selecting the tree structure, the structure shown comprising adders and subtractors is obtained. In the exemplary embodiment shown, the adders and subtractors are a maximum of 22 bits long. This also applies to the register 13. The low calculation accuracy is compensated for by the correction terms. This serves to achieve an optimum for high calculation accuracy and, at the same time, low area requirement.

Figure 7:
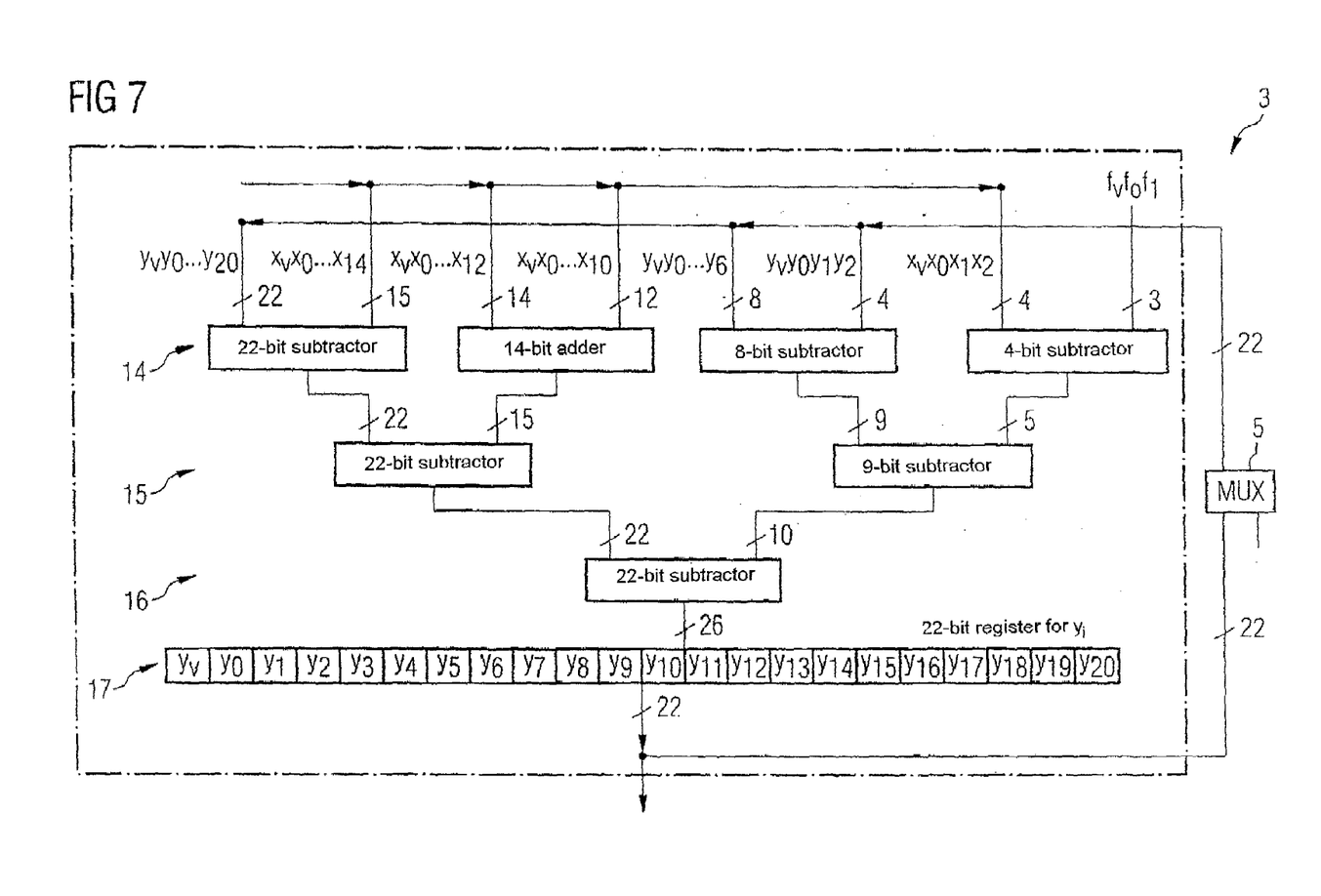
FIG. 7 depicts a further exemplary embodiment of a function block for calculating a cosinusoidal signal in accordance with the invention.

FIG. 7 shows an exemplary embodiment of the adding block 3 for calculating the sine value $y_{i+1}$. The adding block 2 shown is used to calculate the sine value $y_{i+1}$ for the same example as in FIG. 5. In this case, the correction terms $f_v f_0 f_1$ are made available from a correction ROM on the first level 14 of the adding block 3.

Figure 8:
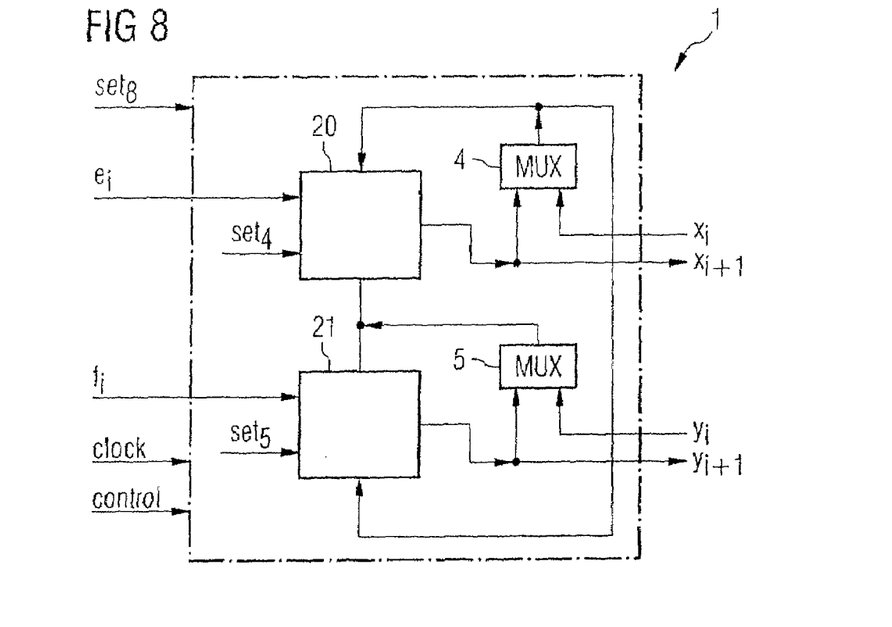
FIG. 8 depicts a further exemplary embodiment of an electrical circuit for calculating a sinusoidal and a cosinusoidal signal in accordance with the invention.

A further exemplary embodiment of the electrical circuit for generating a sinusoidal signal and a cosinusoisal signal is shown in FIG. 8. As input signals, the electrical circuit 1 receives the clock signal clock, the control signal control, the setting signal set$_8$, the correction term $e_i$, the correction term $f_i$, the sine value for the present time $y_i$ and the cosine value for the present time $x_i$.

The electrical circuit 1 outputs the cosine value for the following time $x_{i+1}$ and the sine value for the following time $y_{i+1}$. The electrical circuit 1 contains a first adding block 20 and a second adding block 21, which are of the same design. Both adding blocks 20 and 21 receive the cosine value $x_i$ and the sine value $y_i$, the output signal from the multiplexer 5. Additionally, the first adding block 20 receives the correction term $e_i$ and the setting signal set$_4$. The second adding block 21 additionally has the correction term $f_i$ and the setting signal set$_5$ as input signals.

The first adding block 20 outputs the cosine value $x_{i+1}$ for the following time and the adding block 21 outputs the sine value $y_{i+1}$ for the following time. The different functionality of the adding blocks 20 and 21, which are otherwise of the same design, is obtained through different programming with the setting signals set$_4$ and set$_5$. The multiplexers 4 and 5 take the clock signal clock and the control signal control as a basis for transferring either $x_i$ and $y_i$ or the output values $x_{i+1}$ and $y_{i+1}$. To generate the cosine values $x_{i+1}$ and sine values $y_{i+1}$ for the following time, the successions of digitized amplitude values are calculated and output at discrete times per clock cycle after input of the starting values $x_{i=0}=1$ and $y_{i=0}=0$.

Figure 9:
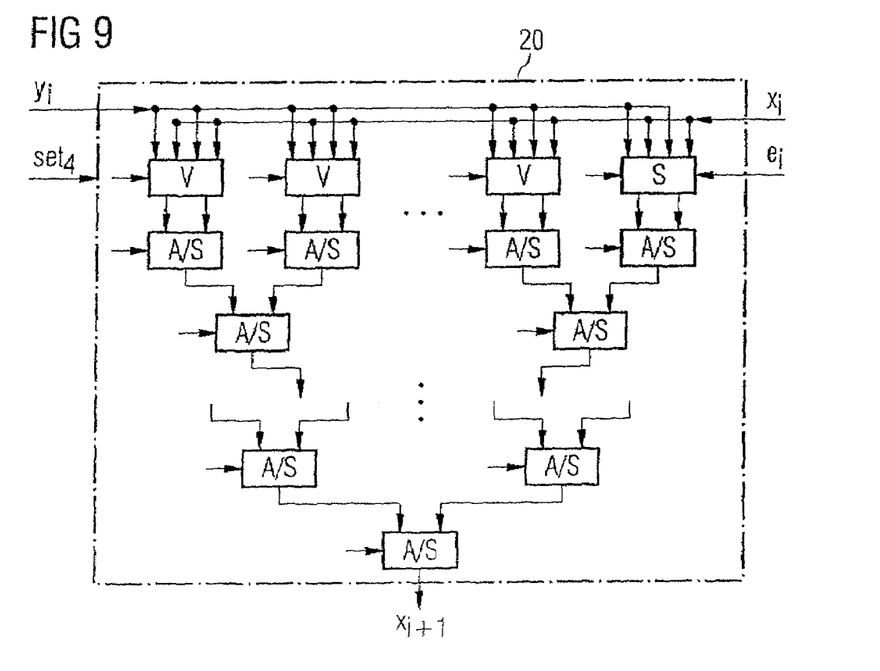
FIG. 9 depicts details of a function block of FIG. 8.

The structures used for the adding blocks 20 and 21 are shown in FIG. 9. As input signal, the adding block 20 receives the cosine value $x_i$ and the sine value $y_i$ for the present time i, and also the error correction term $e_i$ and the setting signal set$_4$.

The adding block 20 contains distribution networks V, a switching network S and switchable adding and subtracting networks A/S. The four inputs of the distribution networks V and the switching network S receive two respective bits from the sine signal $y_i$ and the cosine signal $x_i$. The two outputs of the distribution networks V and the switching networks S are connected to two inputs of the adding and subtracting networks A/S. Each adding and subtracting network A/S has an output. The outputs of two respective adding and subtracting networks A/S are connected to the inputs of an adding and subtracting network A/S which follows on a subsequent level. Hence, the number of adding and subtracting networks A/S is halved from level to level. On the final level, there is now just one adding and subtracting network A/S. This outputs the cosine value $x_{i+1}$ for the following time. The adding and subtracting networks A/S are arranged on a plurality of successive levels.

The distribution networks V, the switching networks S and the switchable adding and subtracting networks A/S are initialized individually. All initialization operations are combined by means of the setting signal $set_4$. The cosine value $x_{i+1}$ for the following time is generated as a function of the cosine value $x_i$ and of the sine value $y_i$ and also of the correction value $e_i$.

Figure 10:
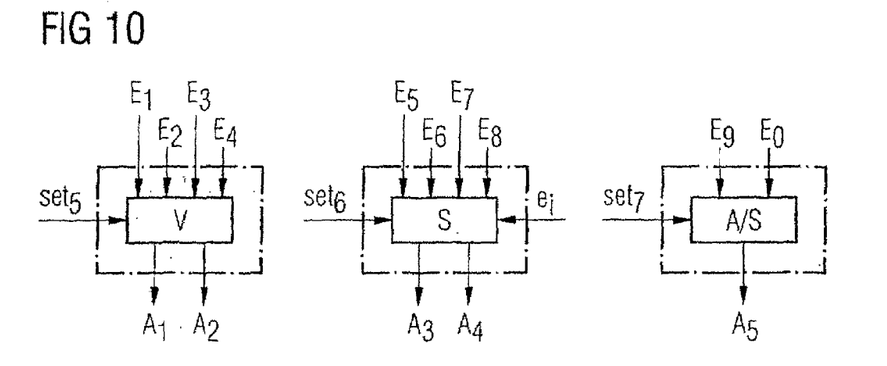
FIG. 10 depicts details of certain elements of FIG. 9.

Details of the distribution networks V, of the switching networks S and of the adding and subtracting networks A/S in the adding block 20 are shown in FIG. 10. The distribution network V has four inputs $E_1$, $E_2$, $E_3$ and $E_4$. It is initialized by the setting signal $set_5$, and its output outputs the signals $A_1$ and $A_2$. By way of example, the setting signal $set_5$ sets the following function:

$$(A_1=(E_1 U E_2)) \cap (A_2=(E_3 U E_4))$$

The switching network receives the input signals $E_5$, $E_6$, $E_7$ and $E_8$, the setting signal $set_6$ and the correction signal $e_i$. It outputs signals $A_3$ and $A_4$. The switching network S performs the function of connecting the input values $E_5$, $E_6$, $E_7$, $E_8$ and $e_i$ to the outputs $A_3$ and $A_4$. The digital function is set once, for example, in the initialization phase by the setting signal $set_6$:

$$((A_3=(E_5 U E_6)) \cap (A_4=(E_7 U E_7 U e_i))) U$$

$$(A_3=(E_5 U E_6 U e_i)) \cap (A_4=(E_7 U E_8)))$$

The input of the adding and subtracting network A/S receives the signals $E_9$ and $E_0$, and the adding and subtracting network A/S outputs the output signal $A_5$ on the basis of the setting signal $set_7$. An adding and subtracting network A/S performs the function of connecting the input values $E_9$ and $E_0$ to the output $A_5$. The following digital function is set by the setting signal $set_7$:

$$(A_5=E_9-E_0) U (A_5=E_9+E_0)$$

In addition, the number of binary digit positions to be processed is set by the setting signal $set_7$ in the initialization phase such that this can also be used to stop the continual jamming of defined arbitrary binary digit positions "0" or "1" in the switchable adding and subtracting network.

In summary, it can be stated that numerically suitable linearization of the sine and cosine functions provides signal generation optimized in terms of area and gates on the basis of pure adding and subtracting networks. The implementation can be set and optimized for all desired parameter sets and can be synthesized using purely digital logic.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Electrical circuit
2 Adding block
3 Adding block
4 Multiplexer
5 Multiplexer
6 Multiplier
7 Multiplier
8 Adder
10 First level
11 Second level
12 Third level
13 Register
14 First level
15 Second level
16 Third level
17 Register
20 First adding block
21 Second adding block
100 Function generator
101 Test apparatus
102 Tester
103 Loadboard
104 Semiconductor component to be tested
105 Evaluation apparatus

What is claimed:

1. A test apparatus for testing a semiconductor component, the test apparatus comprising:
   a loadboard comprising an evaluation apparatus, a function generator and connections that connect to the semiconductor component to be tested; and
   a tester that controls the evaluation apparatus, the function generator and the semiconductor component to be tested;
   wherein:
      an input of the evaluation apparatus is connected to a connector that connects to an output of the semiconductor component to be tested, and an output of the function generator is connected to an input of the evaluation apparatus, to a connector that connects to an input of the integrated semiconductor component to be tested or to an internal node of the semiconductor component; and
      the function generator comprises a first adding block that includes a sine input, a cosine input and an output, the first adding block being configured to calculate the cosine value $x_{i+1}$ for the following time (i+1)*h, where h is a stipulated step size and i is a natural number, and a second adding block that includes a sine input, a cosine input and an output, the second adding block being configured to calculate the sine value $y_{i+1}$ for the following time (i+1)*h, the sine inputs of the first and second adding blocks have the sine value $y_i$ for the present time i*h applied to them, the cosine inputs of the first and second adding blocks have the cosine value $x_i$ for the present time i*h applied to them, and the number of periods to be output and the step size h are set by input signals provided to the function generator.

2. The test apparatus of claim 1, wherein each of the first and second adding blocks includes a respective correction input, the correction inputs being connected with respective data stores that contain correction values for a plurality of times.

3. The test apparatus of claim 1, wherein the frequency and the amplitude resolution of the function generator are programmed by input signals provided to the function generator.

4. The test apparatus of claim 1, wherein the first adding block calculates the value for the cosine value $x_{i+1}$ based upon the formula:

$$x_{i+1}=a*x_i+b*y_i+e_i;$$

and the second adding block calculates the sine value $y_{i+1}$ based upon the formula:

$$y_{i+1}=d*y_i+c*x_i+f_i;$$

where a, b, c and d are constants and where $e_i$ and $f_i$ are error correction terms for the present time i*h.

5. The test apparatus of claim 4, wherein:
the first adding block calculates the cosine value $x_{i+1}$ based upon the formula:

$$x_{i+1}=x_i-x_i*\Sigma r_j*2^{-j}-y_i*\Sigma s_j*2^{-j}+e_i;$$

and the second adding block calculates the sine value $y_{i+1}$ on the basis of the formula $$y_{i+1}=y_i-y_i*\Sigma r_j*2^{-j}+x_i*\Sigma s_j*2^{-j}+f_i;$$

where $\Sigma r_j*2^{-j}$ and $\Sigma s_j*2^{-j}$ are exponential representations of constants with $r_j$, $s_j \in \{0,1\}$ and $j \in [0,1,2,\ldots,p]$, p is a calculation accuracy; and
the first and second adding blocks include adders, subtractors and shifters, and multiplication operations are performed by by the first and second adding blocks via the adders, subtractors and shifters.

6. The test apparatus of claim 5, wherein a multiplication operation in the each of the first and second adding blocks is performed by recursive addition in a single adder.

7. The test apparatus of claim 5, wherein a multiplication operation is performed in each of the first and second adding blocks in a tree structure comprising parallel and series-connected adders and subtractors.

8. The test apparatus of claim 7, further comprising:
a first register that stores the cosine value $x_{i+1}$ and is connected downstream of the tree structure comprising the adders and subtractors in the first adding block;
a second register that stores the sine value $y_{i+1}$ and is connected downstream of the tree structure comprising the adders and subtractors in the second adding block; and
a flow controller to which a clock signal is supplied connects outputs of the first and second registers to the cosine inputs and the sine inputs of the first and second adding blocks in a subsequent clock cycle, with the output of the first register being connected to the cosine inputs, and the output of the second register being connected to the sine inputs.

9. The test apparatus of claim 1, wherein the test apparatus is configured to test mixed-signal semiconductor components.

10. An electrical circuit for generating a sinusoidal signal, the electrical circuit comprising:
a first adding block to calculate a cosine value $x_{i+1}$ for the following time (i+1)*h, with h being a stipulated step size and i being a natural number, wherein the first adding block includes a sine input, a cosine input, a correction input and an output; and
a second adding block to calculate a sine value $y_{i+1}$ for the following time (i+1)*h, wherein the second adding block includes a sine input, a cosine input, a correction input and an output;
wherein the sine inputs of the first and second adding blocks include the sine value $y_i$ for the present time i*h applied to the first and second adding blocks, the cosine inputs of the first and second adding blocks include the cosine value $x_i$ for the present time i*h applied to the first and second adding blocks, and the correction inputs of the first and second adding blocks are connected to respective data stores that store correction values for a plurality of times.

11. The electrical circuit of claim 10, wherein:
the first adding block calculates the cosine value $x_{i+1}$ based upon the formula:

$$x_{i+1}=a*x_i+b*y_i+e_i;\text{ and}$$

the second adding block calculates the sine value $y_{i+1}$ based upon the formula:

$$y_{i+1}=d*y_i+c*x_i+f_i;$$

where a, b, c and d are constants and where $e_i$ and $f_i$ are error correction terms for the present time i*h.

12. The electrical circuit of claim 10, wherein the number of periods n to be output and the step size h are set by input signals to the electrical circuit.

13. The electrical circuit of claim 10, wherein the frequency and the amplitude resolution of the sinusoidal signal output by the electrical circuit are programmed by input signals to the electrical circuit.

14. The electrical circuit of claim 11, wherein:
the first adding block calculates the cosine value $x_{i+1}$ based upon the formula:

$$x_{i+1}=x_i-x_i*\Sigma r_j*2^{-j}-y_i*\Sigma s_j*2^{-j}+e_i;$$

the second adding block calculates the sine value $y_{i+1}$ based upon the formula:

$$y_{i+1}=y_i-y_i*\Sigma r_j*2^{-j}+x_i*\Sigma s_j*2^{-j}+f_i;$$

where $\Sigma r_j*2^{-j}$ and $\Sigma s_j*2^{-j}$ are exponential representations of constants with $r_j$, $s_j \in \{0,1\}$, $j \in [0,1,2,\ldots,p]$, and p is a calculation accuracy; and
each of the first and second adding blocks includes adders, subtractors, multiplexers and shifters, and multiplication operations are performed by the first and second adding blocks via the adders, subtractors, multiplexers and shifters.

15. The electrical circuit of claim 14, wherein a multiplication operation is performed in each of the first and second adding blocks by recursive addition in a single adder.

16. The electrical circuit of claim 14, wherein a multiplication operation is performed in each of the first and second adding blocks via a tree structure comprising parallel and series-connected adders and subtractors.

17. The electrical circuit of claim 16, wherein the adders and subtractors of each of the first and second adding blocks comprise canonical elements which are set according to the stipulated step size h.

18. The electrical circuit of claim 16, further comprising:
a first register that stores the cosine value $x_{i+1}$ and is connected downstream from the tree structure comprising the adders and subtractors in the first adding block;
a second register that stores the sine value $y_{i+1}$ and is connected downstream from the tree structure comprising the adders and subtractors in the second adding block; and
a flow controller to which a clock signal is supplied connecting outputs of the first and second registers to the cosine inputs and the sine inputs of the first and second adding blocks in a subsequent clock cycle, wherein the output of the first register is connected to the cosine inputs, and the output of the second register is connected to the sine inputs.

19. A method for testing a semiconductor component comprising:
(I) providing a tester, a loadboard and an evaluation apparatus;

(II) providing the loadboard with the semiconductor component to be tested;

(III) generating a reference signal in the following manner:
- (a) providing a number n of periods for which signal values are generated, where n is a natural number greater than 1;
- (b) providing a number m of samples, where n and m are prime numbers;
- (c) providing a step size h based upon the equation $h=n*360°/m$;
- (d) providing an initial value for the cosine $x_0$ and for the sine $y_0$;
- (e) calculating a cosine value $x_{i+1}$ and a sine value $y_{i+1}$ for the following time $(i+1)*h$ and from the sine value $y_i$ and the cosine value $x_i$ for the present time $i*h$, the calculation being performed in an electrical circuit which is provided on the loadboard or in the semiconductor component to be tested; and
- (f) repeating (e) in a loop with a control variable i which runs from 0 to m; and (IV) operating the semiconductor component using a test sequence, including applying the reference signal to the semiconductor component or to the evaluation apparatus.

20. The method of claim 19, wherein the cosine value $x_{i+1}$ is calculated in (III)(e) based upon the formula:

$$x_{i+1}=a*x_i+b*y_i+e_i;$$

and the sine value $y_{i+1}$ is calculated based upon the formula:

$$y_{i+1}=d*y_i+c*x_i+f_i;$$

where a, b, c and d are constants and where $e_i$ and $f_i$ are error correction terms for the present time $i*h$.

21. The method of claim 20, wherein the value for the cosine value $x_{i+1}$ is calculated based upon the formula:

$$x_{i+1}=x_i-x_i*\Sigma r_j*2^{-j}-y_i*\Sigma s_j*2^{-j}+e_i;$$

and the sine value $y_{i+1}$ is calculated based upon the formula:

$$y_{i+1}=y_i-y_i*\Sigma r_j*2^{-j}+x_i*\Sigma s_j*2^{-j}+f_i;$$

where $\Sigma r_j*2^{-j}$ and $\Sigma s_j*2^{-j}$ are exponential representations of constants with $r_j$, $s_j \epsilon \{0,1\}$ and $j\epsilon[0,1,2,\ldots,p]$, $e_i$ and $f_i$ are error correction terms for the present time, p is a calculation accuracy, and the multiplication operations are performed by additions, subtractions and shifts.

22. The method of claim 21, wherein a multiplication operation is performed in a plurality of recursive additions via a single adder.

23. The method of claim 22, wherein a multiplication operation is performed via a tree structure comprising parallel and series-connected adders and subtractors.

* * * * *